(12) United States Patent
Ho (10) Patent No.: US 6,903,382 B2
(45) Date of Patent: Jun. 7, 2005

(54) LIGHT EMITTING DIODE MOUNTING STRUCTURE

(75) Inventor: Ying-Ming Ho, Taipei (TW)

(73) Assignee: LighTop Technology Co., Ltd., Chung-Ho (TW)

(*) Notice: Subject to any disclaimer, the term of this patent is extended or adjusted under 35 U.S.C. 154(b) by 162 days.

(21) Appl. No.: 10/612,900

(22) Filed: Jul. 7, 2003

(65) Prior Publication Data

US 2005/0006658 A1 Jan. 13, 2005

(51) Int. Cl.$^7$ .............................................. H01L 33/00
(52) U.S. Cl. ........................................................ 257/99
(58) Field of Search ............................................ 257/99

(56) References Cited

U.S. PATENT DOCUMENTS

| | | | | |
|---|---|---|---|---|
| 3,774,086 A | * | 11/1973 | Vincent, Jr. ................... 257/95 |
| 3,805,347 A | * | 4/1974 | Collins et al. ................ 445/24 |
| 3,816,847 A | * | 6/1974 | Nagao ......................... 257/98 |
| 5,550,675 A | * | 8/1996 | Komatsu ...................... 359/514 |
| 5,825,054 A | * | 10/1998 | Lee et al. ..................... 257/98 |
| 6,365,920 B1 | * | 4/2002 | Abramov et al. ............. 257/81 |

FOREIGN PATENT DOCUMENTS

JP  359003984 A  *  1/1984

* cited by examiner

Primary Examiner—David A. Zarneke (57) ABSTRACT

A light emitting diode mounting structure includes a metal plate provided with a plurality of openings and at least one fixed plastic base according to requirements. The plate is also disposed with a pillar wire holder at a lower portion thereof, and a column having a recess at a center of an upper portion thereof. The recess is placed with a chip. Another pillar wire holder is provided parallel to the aforesaid wire holder, and has one end thereof penetrated through the fixed plastic base, and the penetrated end thereof is connected to the chip via a metal wire. Epoxy is filled into a mold, and the metal plate is placed into the mold for encapsulation. Or, epoxy is filled into an outer housing, and the metal plate is placed into the outer housing for forming a light emitting diode.

7 Claims, 14 Drawing Sheets

LIGHT EMITTING DIODE MOUNTING STRUCTURE

BACKGROUND OF THE INVENTION (a) Field of the Invention

The invention relates to a light emitting diode mounting structure, and more particularly, to a light emitting diode mounting structure having a plate that is exposed at a lower portion thereof and is not encapsulated by epoxy. When the light emitting diode is illuminated, thermal energy produced by a control chip therein is thoroughly dissipated via the plate and pillar wire holders thereof, thereby lengthening lifespan and increasing light intensity of the light emitting diode.

(b) Description of the Prior Art

Figure 13:
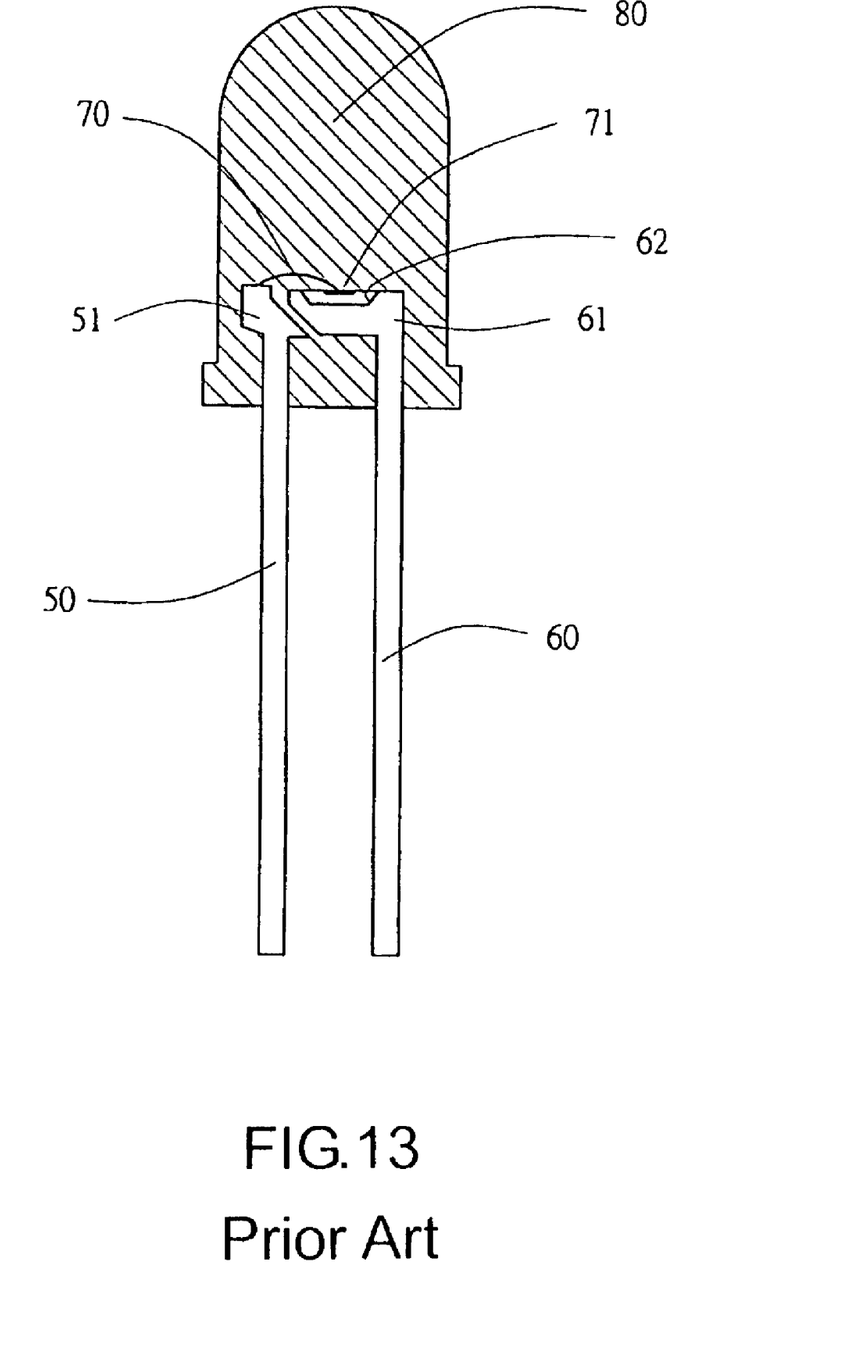
FIG. 13 shows a conventional structure view of a prior light emitting diode producing monochromatic light.

Referring to FIG. 13 showing a conventional structural view of a prior art, a light emitting diode producing monochromatic light comprises two parallel pillar wire holders 50 and 60 disposed with relatively flat protruding portions 51 and 61. The protruding portion 61 is provided with a recess 62 placed with a chip 71. The chip 71 is connected to the other protruding portion 51 via a metal wire 70. The protruding portions 51 and 61, the chip 71, and the metal wire 70, are then encapsulated by epoxy 80 for completing the structure of the light emitting diode structure.

Figure 14:
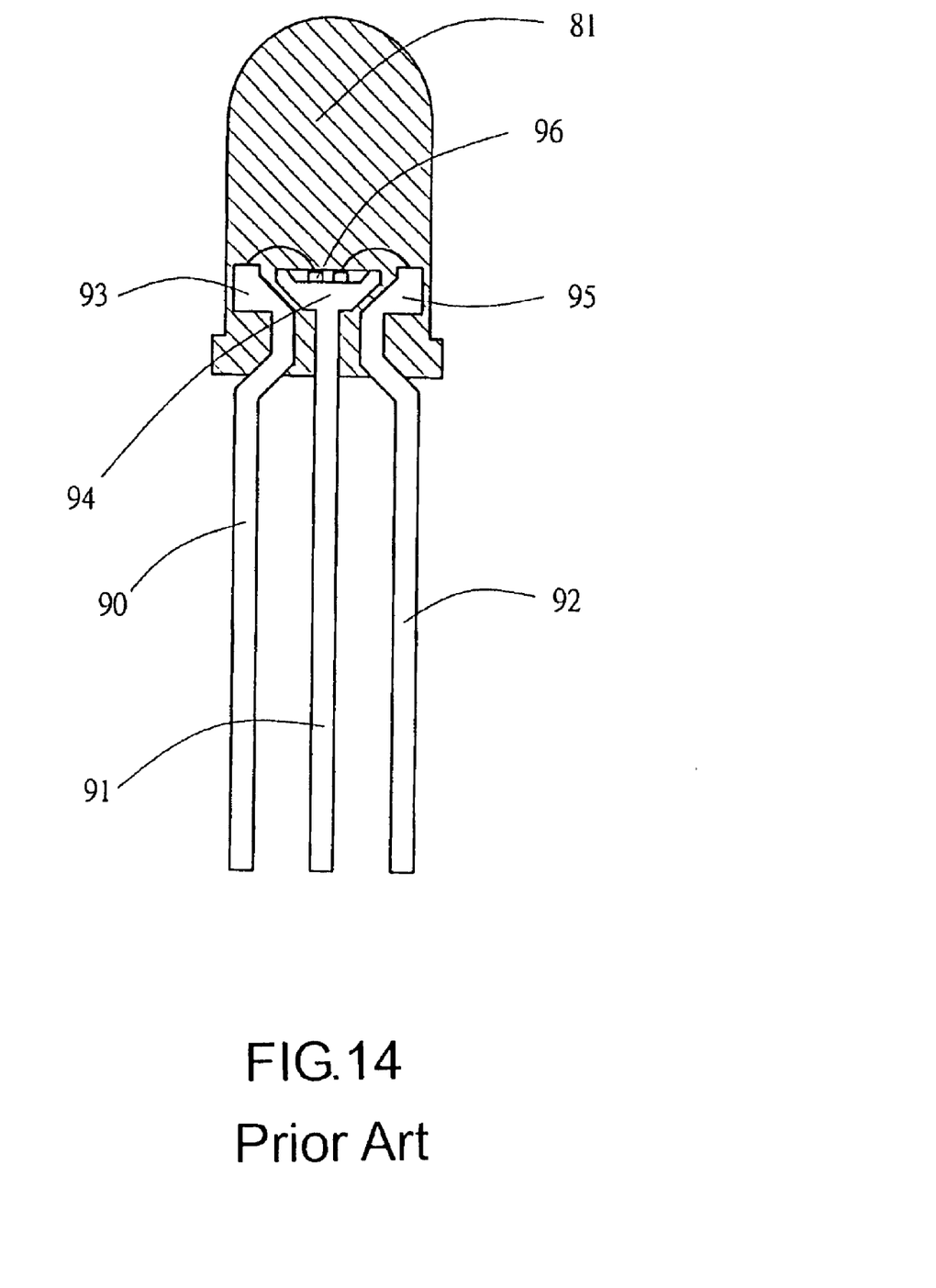
FIG. 14 shows a conventional structure view of a prior light emitting diode producing multicolor light.

Referring to FIG. 14 showing a light emitting diode producing multicolor light, the light emitting diode comprises at least three wire parallel holders 90, 91 and 92, which have certain distances in between and are disposed with protruding portions 93, 94 and 95, respectively. A chip 96 is provided at an appropriate position. All the aforesaid members are then encapsulated by epoxy 81 for completing the structure of the light emitting diode.

However, the aforesaid prior structures are prone to the shortcomings below in lack of satisfactory designs:

1. The protruding portions at the wire holders are entirely encapsulated by epoxy, and areas of the wire holders are rather small. As a result, when the light emitting diode is illuminated, thermal energy produced by a control chip thereof is not easily dissipated, and may damage the metal wires and the chip to further affect an overall quality. Due to inadequate heat dissipation, the light emitting diode fails to fully exercise illumination performance thereof when the light emitting diode is illuminated.

2. The protruding portions at the conducting wires in prior light emitting diodes are encapsulated by epoxy, and hence thermal energy is remained therein for not being able to be effectively dissipated during illumination. In order to avoid the thermal energy from damaging the chip and wires of the light emitting diode, and also to prevent attenuation of light intensity and burning caused by over-heating, light intensity of the prior light emitting diode cannot be elevated. The shortcoming of failure in enhancing light intensity is not only a blind spot but also a bottleneck of the prior art.

SUMMARY OF THE INVENTION

Therefore, the primary object of the invention is to provide a light emitting diode structure capable of rapidly dissipating thermal energy produced by a chip thereof, thereby avoiding attenuation in light intensity and burning as well as elevating illumination performance thereof. Light intensity of the light emitting diode is thus enhanced without leaving behind excessive thermal energy.

To achieve the aforesaid object, the invention comprises a metal plate provided with a plurality of openings and at least one fixed plastic base depending on requirements. The plate is also disposed with a pillar wire holder at a lower portion thereof, and a recess at a center of an upper portion thereof. The recess is placed with a chip. Another pillar wire holder is provided parallel to the aforesaid wire holder, and has one end thereof penetrated through the fixed plastic base, and the penetrated end thereof is connected to the chip via a metal wire. Epoxy is filled into a mold, and the metal plate is placed into the mold for encapsulation. Or, epoxy is filled into an outer housing, and the metal plate is placed into the outer housing for forming a light emitting diode.

DETAILED DESCRIPTION OF THE PREFERRED EMBODIMENTS

To better understand the contents of the invention, detailed descriptions shall be given with the accompanying drawings hereunder.

Figure 1:
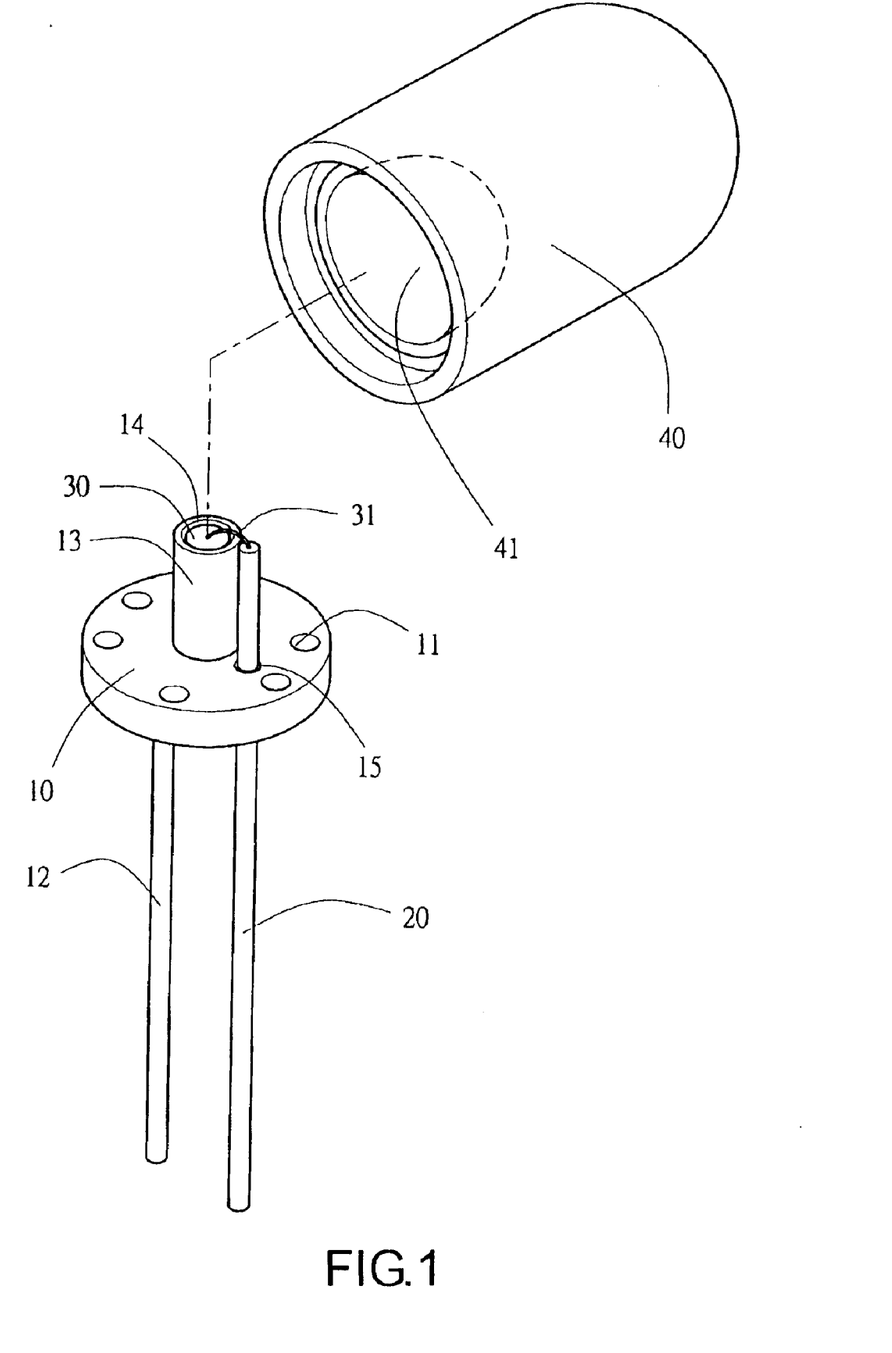
FIG. 1 shows a structural elevational view according to the invention.
Figure 2:
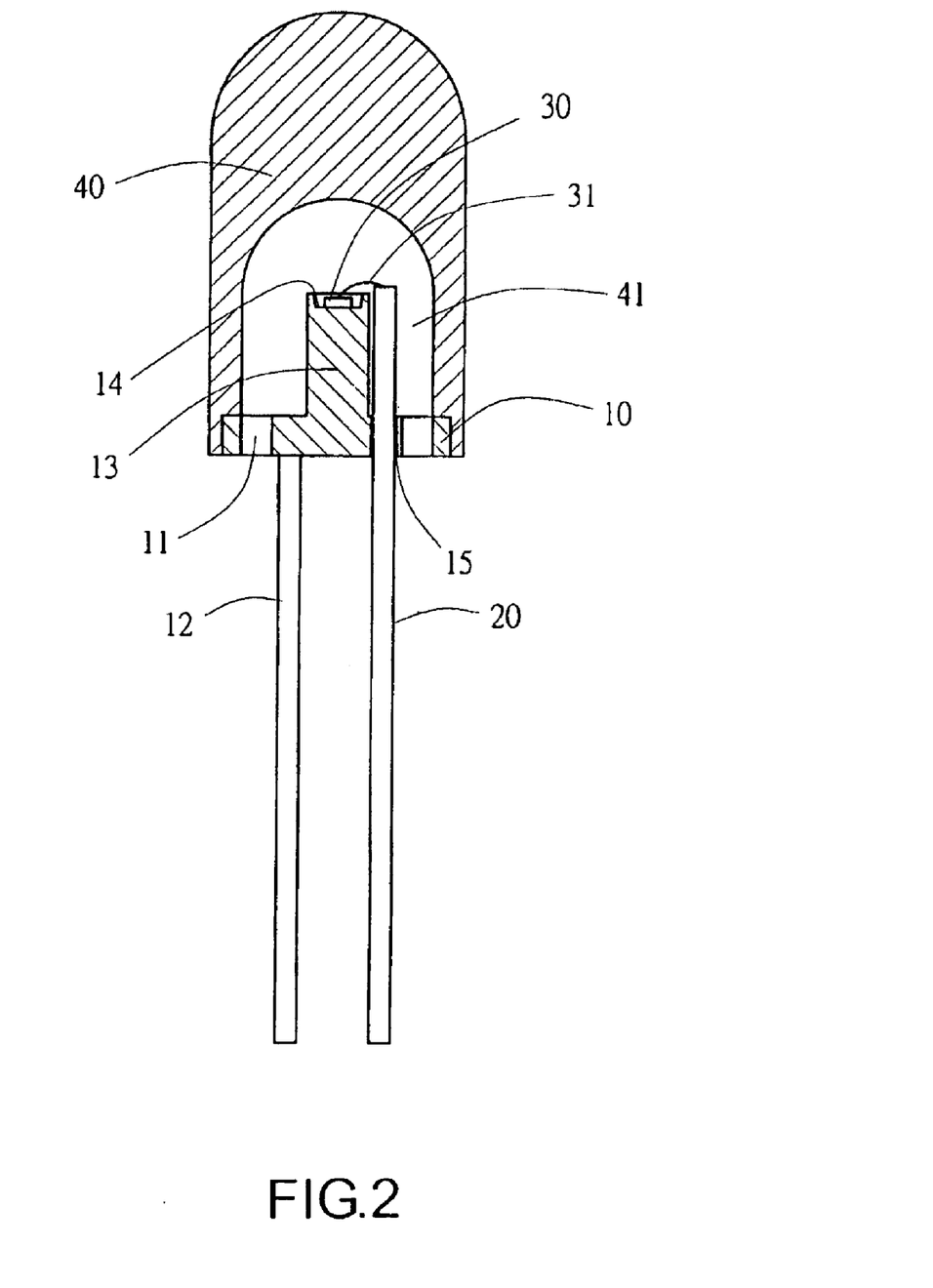
FIG. 2 shows a side sectional view according to the invention.
Figure 3:
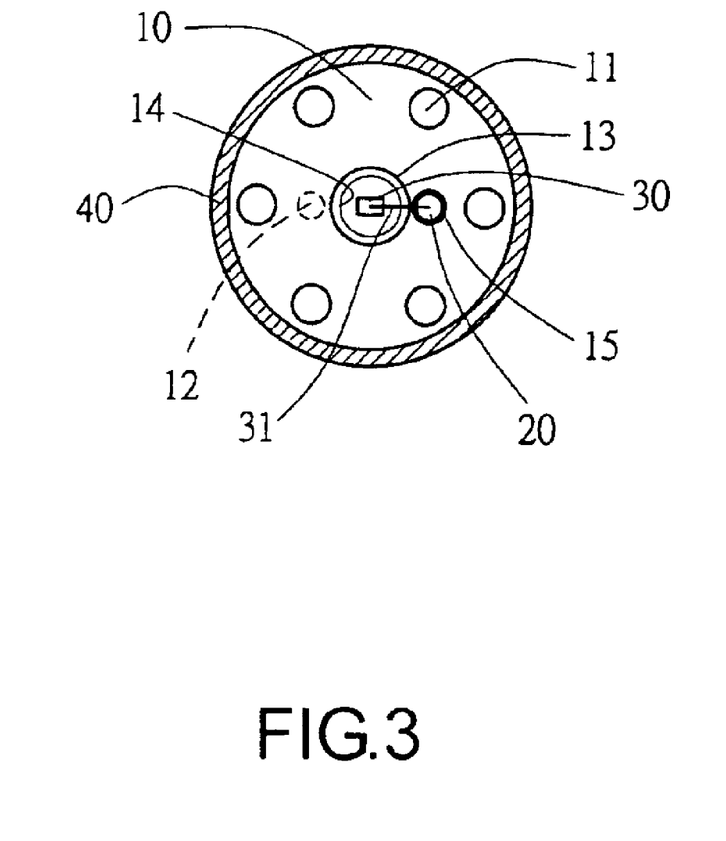
FIG. 3 shows a top structural view according to the invention.

Referring to FIGS. 1, 2 and 3, the invention comprises a metal plate 10, and an outer housing 40. The metal plate 10 may be an appropriate shape of a circle, a rectangle, or a polygon. The plate 10 is penetrated with a plurality of openings 11, and is disposed with at least one fixed plastic base 15. The plate 10 is further disposed with a pillar wire holder 12 at a lower portion thereof, and a column 13 having a recess 14 at a center of an upper portion thereof. The recess 14 is placed with a chip 30. Another pillar wire holder 20 is provided parallel to the aforesaid wire holder 12. The wire holder 20 has one end thereof penetrated through the fixed plastic base 15, and the penetrated end thereof is connected to the chip 30 via a metal wire 31.

The outer housing 40 may be a circular cylinder, a rectangular cylinder, a polyhedral cylinder or a cylinder of any other appropriate shape. An interior the outer housing 40 is filled with epoxy, and the outer housing 40 is provided with a trough 41 at an opening end thereof. The metal plate 10 is placed into the outer housing 40, such that the trough 41 exact accommodates the protruding elements on the metal plate 10 for forming a high quality light emitting diode producing monochromatic light.

Figure 4:
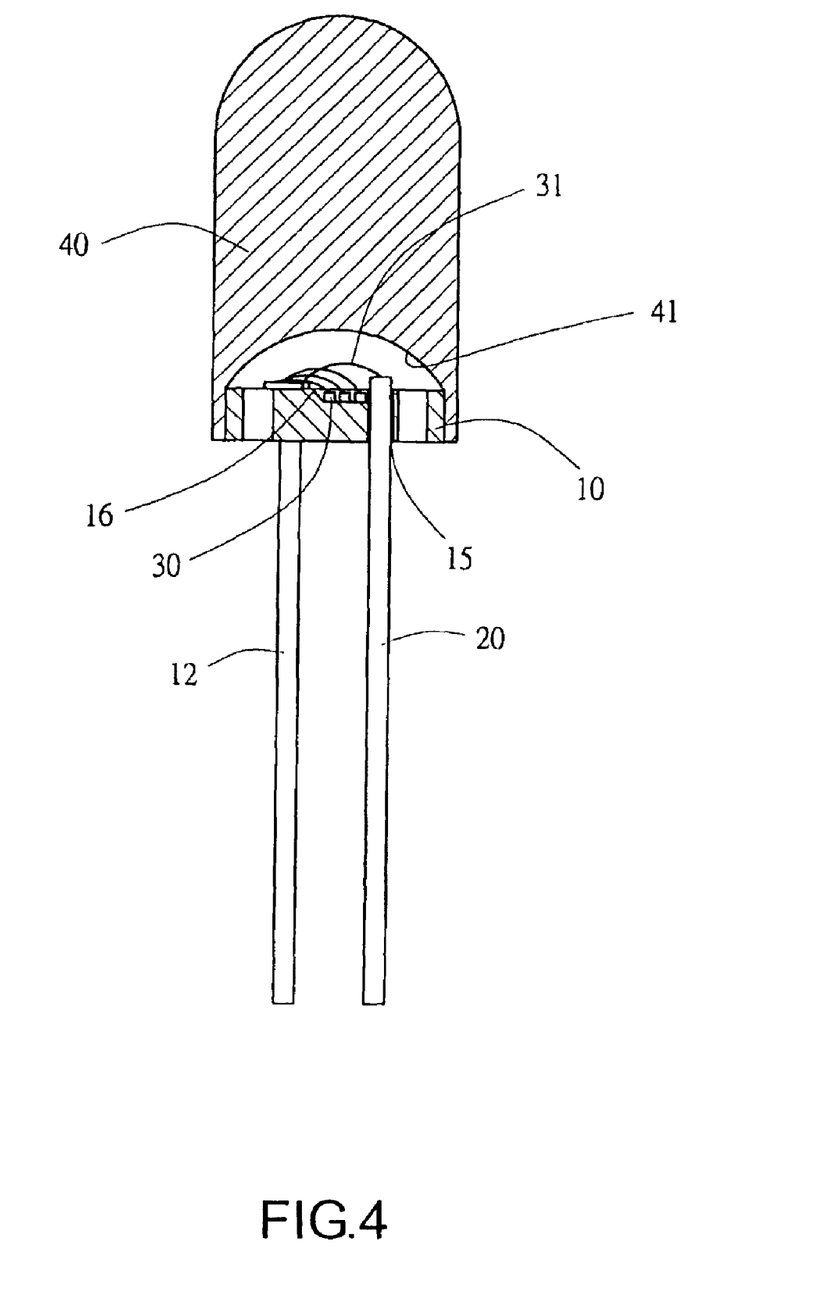
FIG. 4 shows a side sectional view of another embodiment according to the invention.
Figure 5:
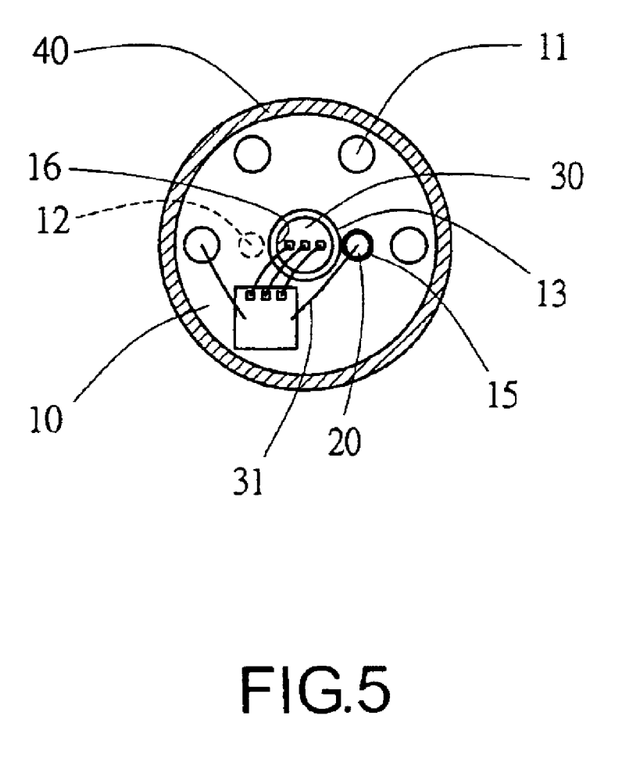
FIG. 5 shows a top view of another embodiment of the invention.
Figure 6:
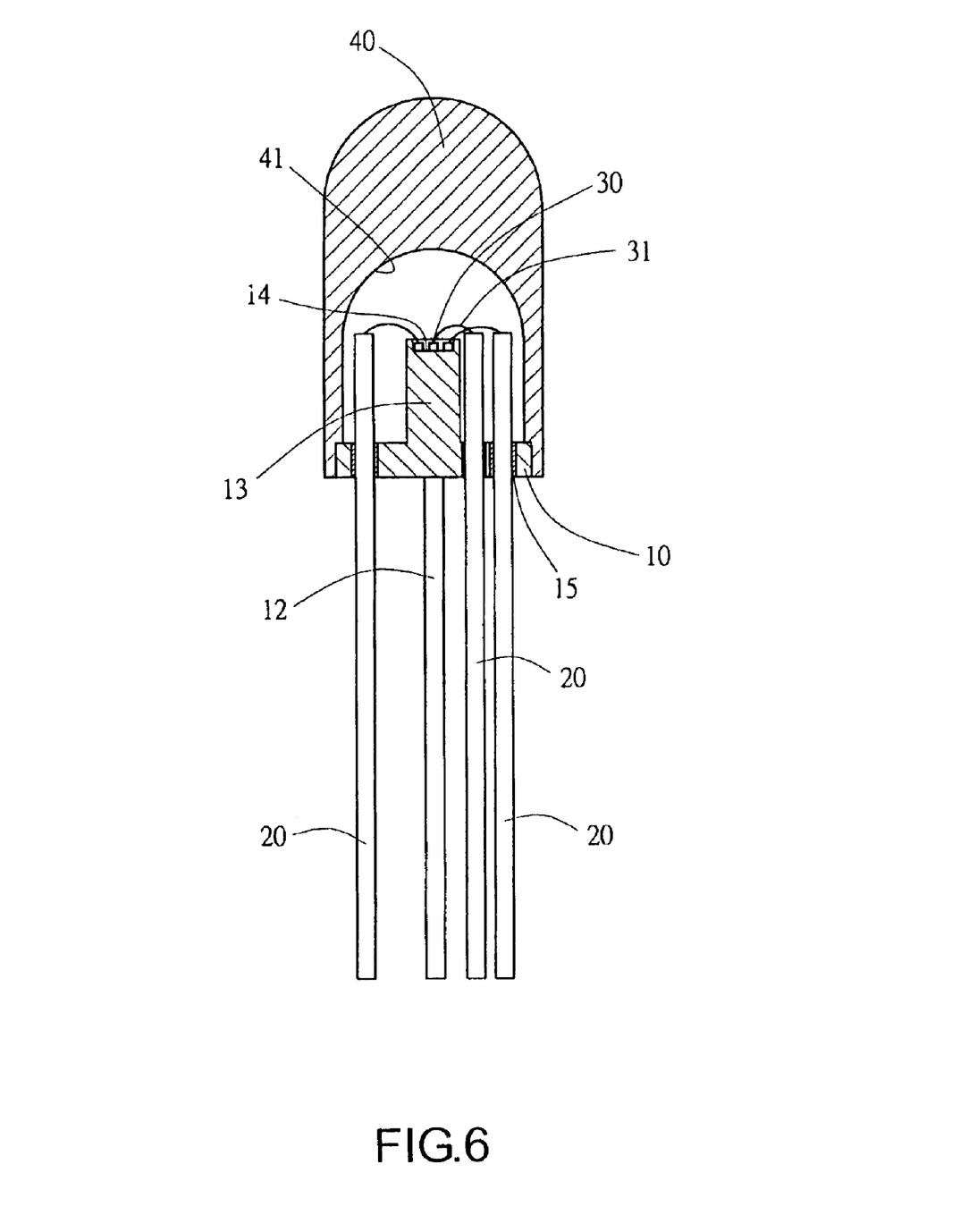
FIG. 6 shows a first structural view according to the invention being applied for producing multicolor light.
Figure 7:
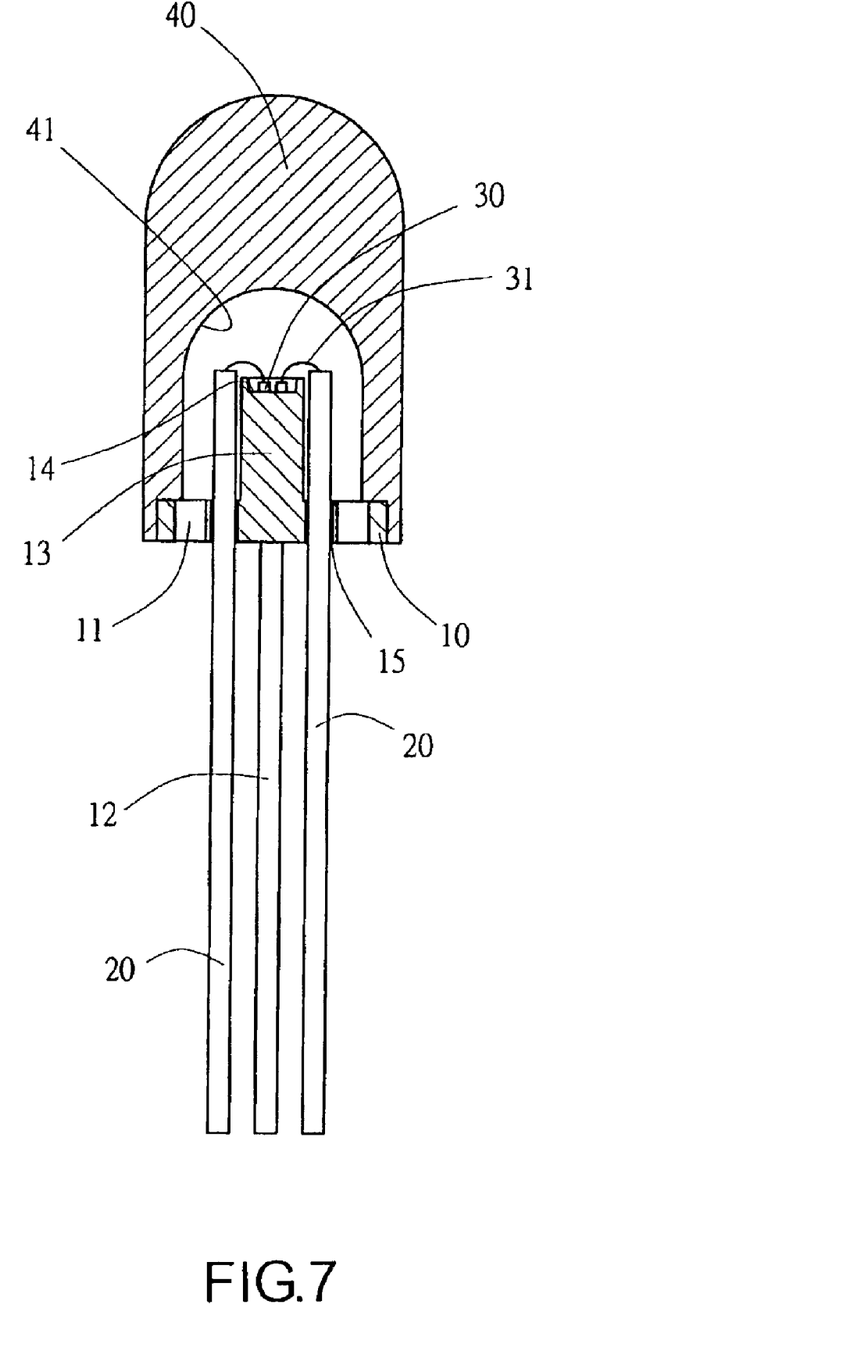
FIG. 7 shows a second structural view according to the invention being applied for producing multicolor light.

Referring to FIGS. 4 and 5 showing another embodiment according to the invention, the plate 10 is directly provided with a recess 16 at a top portion thereof for placing chips 30. The plate 10 is further embedded with controller integrated circuits for forming a light emitting diode producing multicolor light. Referring to FIGS. 6 and 7, a plurality of fixed plastic bases 15 is additionally provided at the plate 20 according to a number of a plurality of wire holders 20, so as to form a light emitting diode producing multicolor light by penetrating the wire holders 20 through the plate 10 and connecting to the chips 30.

Figure 8:
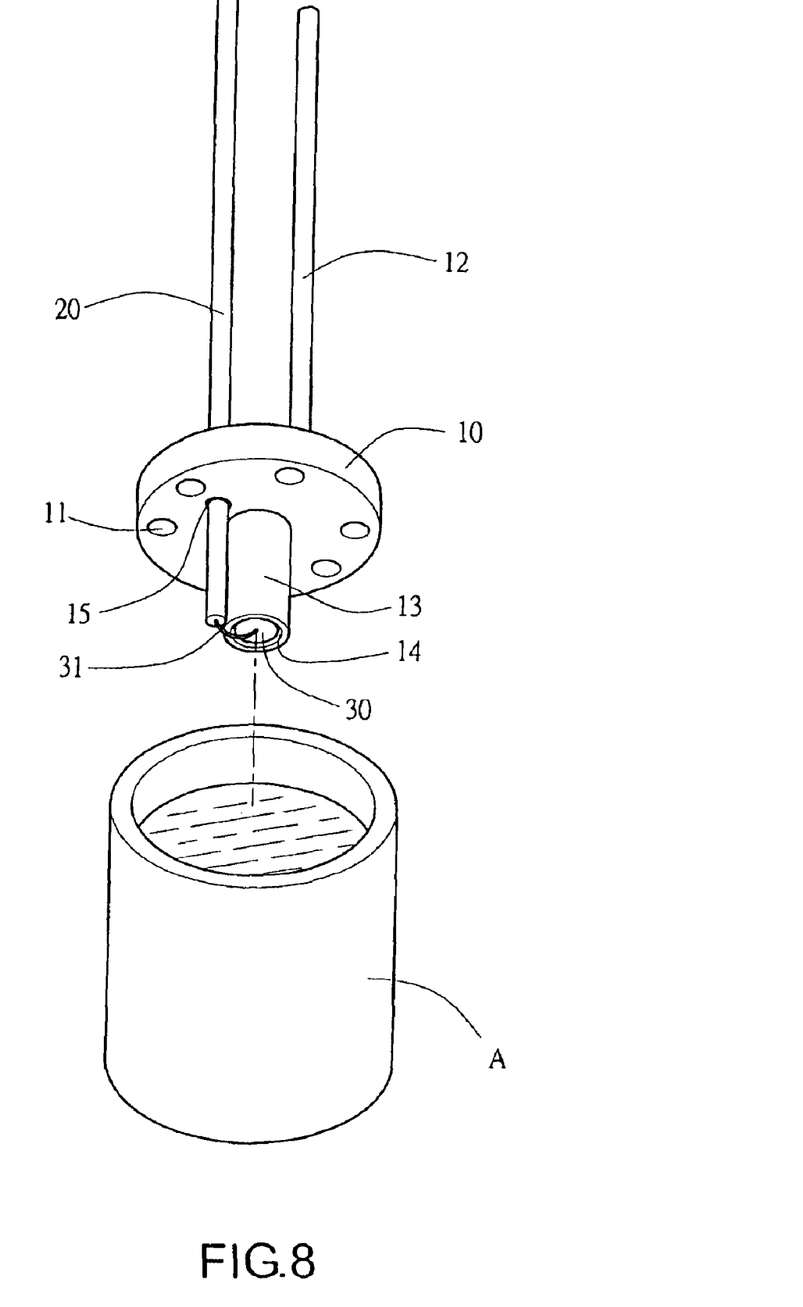
FIG. 8 shows a schematic view of an outer housing in an embodiment according to the invention.
Figure 9:
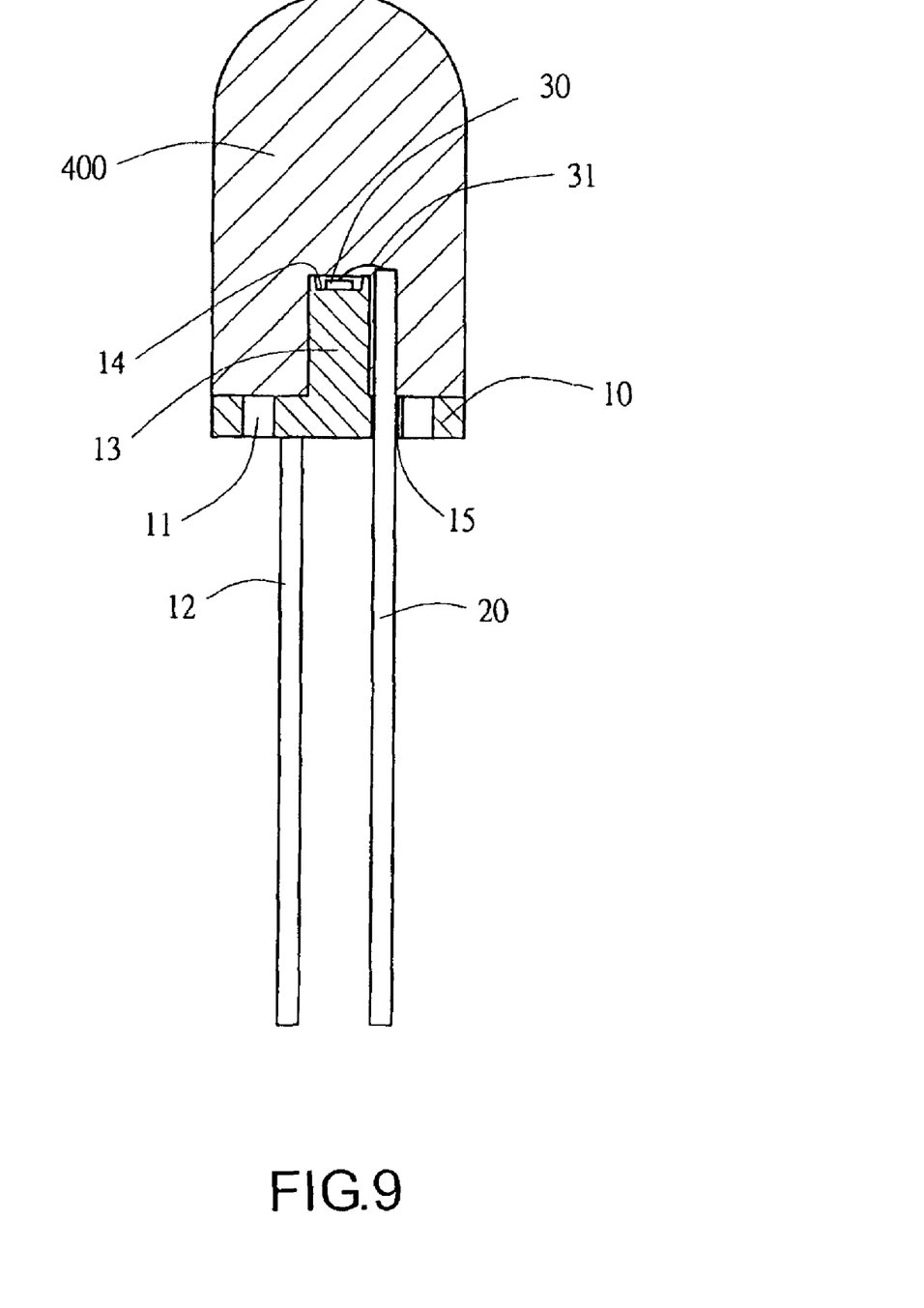
FIG. 9 shows a first embodiment according to the invention.
Figure 10:
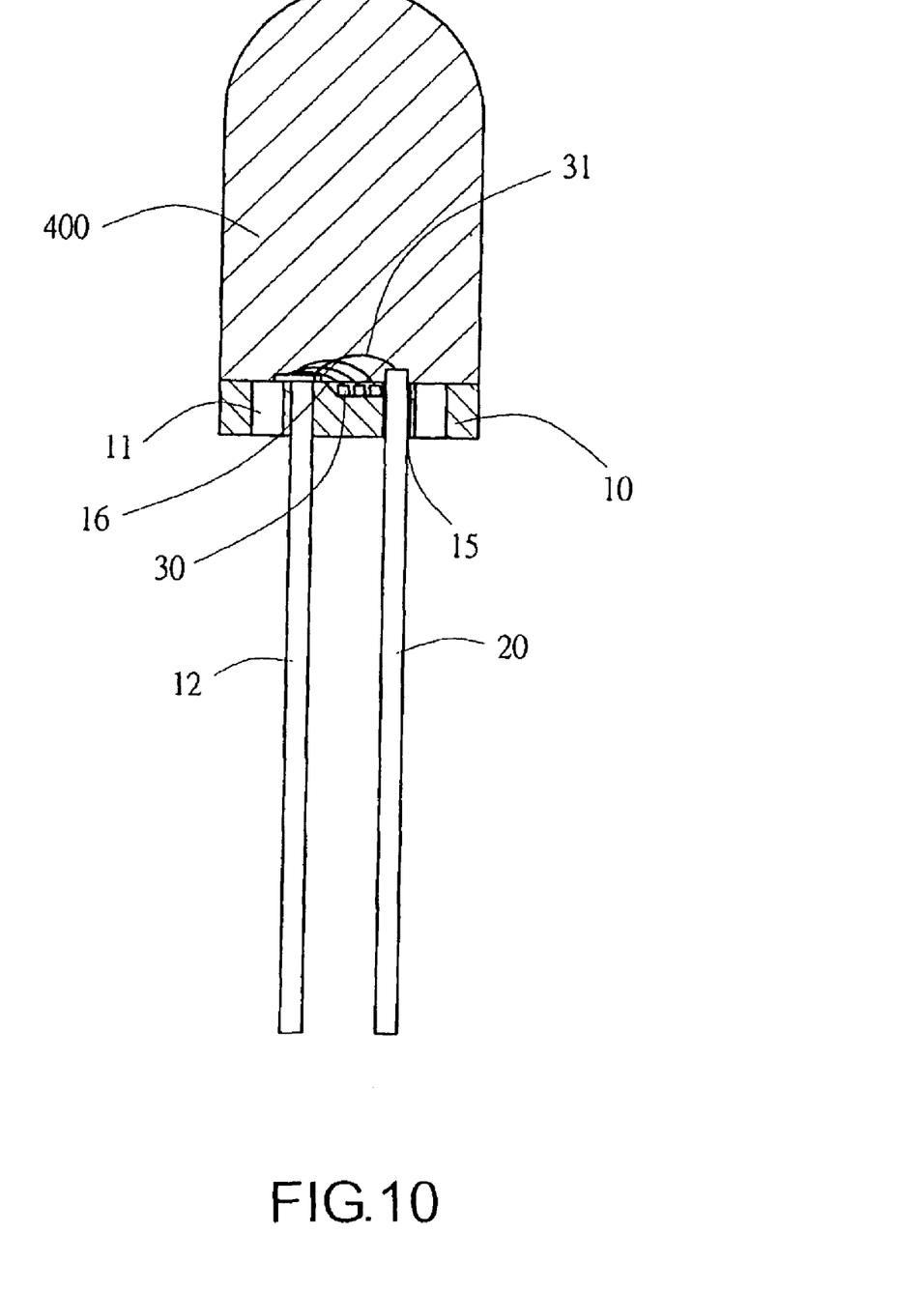
FIG. 10 shows a second embodiment according to the invention.
Figure 11:
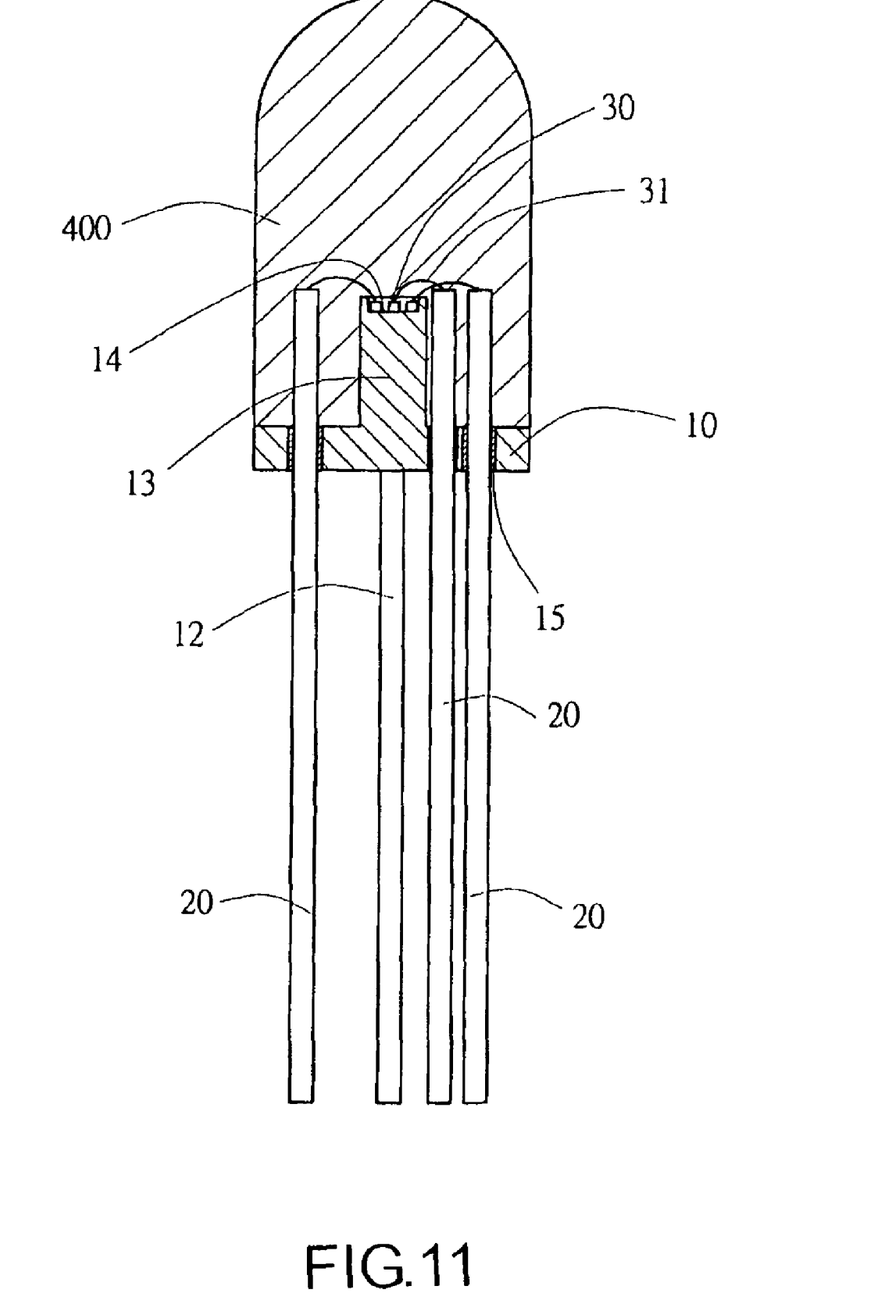
FIG. 11 shows a third embodiment according to the invention.
Figure 12:
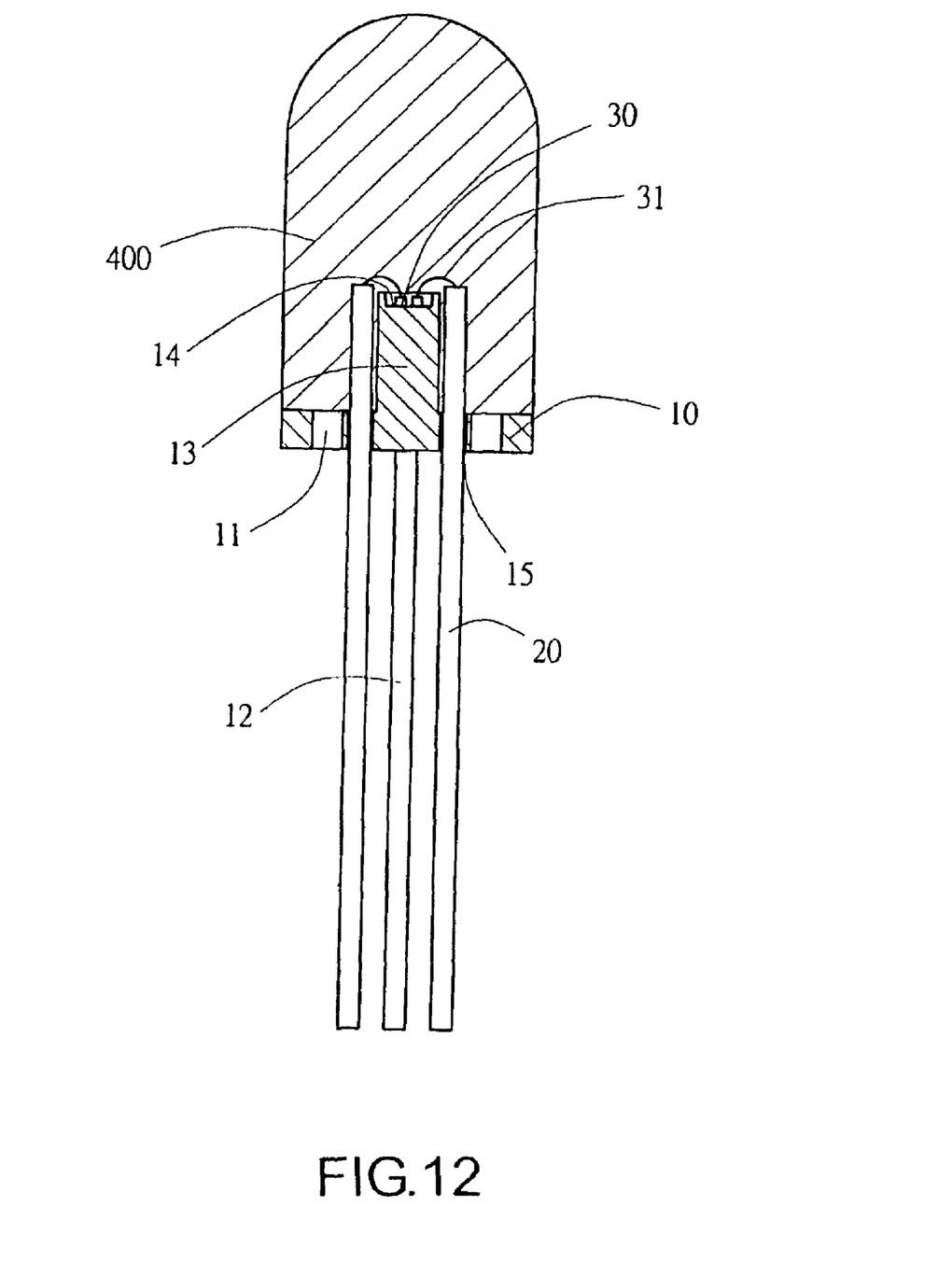
FIG. 12 shows a fourth embodiment according to the invention.

Referring to FIG. 8, according to the invention, an obverse side of the plate 10 is faced downward and placed into a mold A for encapsulation. Front-end elements provided at the plate including the chip 30, the column 13, and the wire holder 20, are dipped into the mold A filled with epoxy. Baking is processed for directly coagulate the epoxy onto the plate 10. The mold A is then separated therefrom, and thus forming an outer housing 400 as shown in FIGS. 9, 10, 11 and 12. The outer housing 400 may be covered onto the top portion of the plate 10 for forming diversified light emitting diodes. It is to be noted that the outer housing 300 may be constructed into various shapes for attending to different requirements, and these modifications are embraced within the scope of the invention.

The invention has the following excellences when put to use:
1. According to the invention, a metal plate is disposed at a mounting structure of a light emitting diode and is also provided with a plurality of openings. When filled with epoxy, the plate is not encapsulated therein. Therefore, thermal energy produced by a chip therein is rapidly dissipated into air, such that attenuation of light intensity or burning caused by excessive heat is avoided for further elevating quality of the light emitting diode.
2. As described above, for that the invention is designed as having rapid heat dissipation effects, illumination performance is relatively increased for elevating light intensity of the light emitting diode without leaving behind excessive thermal energy. To be more precise, the invention is capable of elevating light intensity as well as lengthening lifespan of the light emitting diode.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A light emitting diode mounting structure comprising:
   a metal plate provided with a plurality of openings, at least one fixed plastic base depending on requirements, a pillar wire holder at a lower portion thereof, and a column having a recess at an appropriate position at an upper portion thereof; wherein, the recess is placed with a chip or a controller integrated circuit, another pillar wire holder is provided parallel to the aforesaid wire holder and has one end thereof penetrated through the fixed plastic base, and the penetrated end thereof is connected to the chip via a metal wire; and
   an outer housing filled with epoxy covered onto a top portion of the plate for completing a light emitting diode structure.

2. The light emitting diode mounting structure according to claim 1, wherein the plate is an appropriate shape as a circle, a square or a polygon.

3. The light emitting diode mounting structure according to claim 1, wherein the outer housing is an appropriate shape as a circle, a square or a polygon.

4. The light emitting diode mounting structure according to claim 1, wherein the outer housing is provided with a trough at an opening end thereof for accommodating the plate.

5. The light emitting diode mounting structure according to claim 1, wherein the outer housing is an encapsulation formed by filling epoxy into a mold and placing the metal plate into the mold.

6. The light emitting diode mounting structure according to claim 1, wherein the plate is provided with at least one column further disposed with a recess at a top portion thereof for accommodating the chip.

7. The light emitting diode mounting structure according to claim 1, wherein the plate is provided with a column further disposed with a pared surface at one side thereof for accommodating the chip.

* * * * *